United States Patent
White et al.

(10) Patent No.: US 8,344,496 B1
(45) Date of Patent: Jan. 1, 2013

(54) DISTRIBUTING POWER WITH THROUGH-SILICON-VIAS

(75) Inventors: Thomas Henry White, Santa Clara, CA (US); Giles V. Powell, Alameda, CA (US); Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 203 days.

(21) Appl. No.: 12/432,601

(22) Filed: Apr. 29, 2009

(51) Int. Cl.
*H01L 23/52* (2006.01)

(52) U.S. Cl. ........ 257/691; 257/503; 257/774; 257/758; 257/778; 257/776; 438/108; 438/622; 438/637; 438/672; 438/675

(58) Field of Classification Search ............... 257/777, 257/778, 724, 686, 758, 529, 532, 759, 762, 257/774, 776, 786, 750, 751, 734, 690, 692, 257/693, 700, 678, 503, 782, 781, 713, 691, 257/684; 438/622, 625, 627, 629, 637, 643, 438/675, 612, 614, 106, 108, 109, 618, 619, 438/620, 638, 639, 672, 669; 361/760, 761, 361/762, 763, 764, 767, 778, 777, 780, 748, 361/751, 735, 736
See application file for complete search history.

(56) References Cited

U.S. PATENT DOCUMENTS

| | | | | |
|---|---|---|---|---|
| 5,694,095 A | * | 12/1997 | Mineyoshi | 333/193 |
| 6,828,666 B1 | * | 12/2004 | Herrell et al. | 257/691 |
| 2004/0184248 A1 | * | 9/2004 | Alger et al. | 361/777 |
| 2007/0096254 A1 | * | 5/2007 | Ritter et al. | 257/532 |
| 2008/0081457 A1 | * | 4/2008 | Lin et al. | 438/614 |
| 2009/0057867 A1 | * | 3/2009 | Hool | 257/690 |
| 2010/0252934 A1 | * | 10/2010 | Law et al. | 257/774 |

* cited by examiner

*Primary Examiner* — Ha Tran T Nguyen
*Assistant Examiner* — Thanh Y Tran
(74) *Attorney, Agent, or Firm* — Womble Carlyle Sandridge & Rice, LLP

(57) ABSTRACT

An integrated circuit with distributed power using through-silicon-vias (TSVs) is presented. The integrated circuit has conducting pads for providing power and ground located within the peripheral region of the top surface. A number of through-silicon-vias are distributed within the peripheral region and a set of TSVs are formed within the non-peripheral region of the integrated circuit. Conducting lines on the bottom surface are coupled between each peripheral through-silicon-via and a corresponding non-peripheral through-silicon-via. Power is distributed from the conducting pads to the TSVs within the non-peripheral region through the TSVs within the peripheral region, thus supplying power and ground to circuits located within the non-peripheral region of the integrated circuit chip.

18 Claims, 10 Drawing Sheets

DISTRIBUTING POWER WITH THROUGH-SILICON-VIAS

BACKGROUND

It has been observed that circuits located along edge of the die often perform better than circuits located in the center. One reason is the increasing size and complexity of integrated circuits hampers the ability to distribute power to circuits in the center of the die. This is especially true in advanced technologies with smaller feature sizes and decreasing supply voltages. The conducting lines used to route power throughout the integrated circuit have low resistance, but this resistance becomes significant over long lengths. The resistance in long routing lines causes resistive power drops and the voltage at a given point is a function of the distance away from the bonding pads providing power.

Since most integrated circuits are configured with bonding pads providing power and ground located along the four edges of the die, circuits located at the center of the die may receive significantly reduced voltage compared to circuits located closer to the bonding pads. In addition, the reduction in supply voltage from the edge to the center of the die also depends on the number of circuits drawing power at a given time.

In extreme cases, a large reduction in the voltage to a circuit could cause a circuit to become non-functional. One approach to work around the issue of providing the supply voltage to circuits located in the center of the die is the use of software to optimize the number of circuits located at the edges of the die, but this approach does not address the root cause of the power distribution problem.

It is in this context that embodiments of the invention arise.

SUMMARY

Broadly speaking, the present invention fills these needs by providing a method and apparatus for distributing power to the interior portion of an integrated circuit using through-silicon-vias (TSVs). It should be appreciated that the present invention can be implemented in numerous ways, including as a method, a system, or a device. Several inventive embodiments of the present invention are described below.

In accordance with one aspect of the invention, an integrated circuit chip distributing power using through-silicon-vias is detailed. The integrated circuit has conducting pads for providing power and ground located within the peripheral region of the top surface. A number of through-silicon-vias are formed within the peripheral region and a set of TSVs are formed within the non-peripheral region of the integrated circuit. Conducting lines on the bottom surface are coupled between each peripheral through-silicon-via and a corresponding non-peripheral through-silicon-via. Power is distributed from the conducting pads to the TSVs within the non-peripheral region through the TSVs within the peripheral region, thus supplying power and ground to circuits located within the non-peripheral region of the integrated circuit chip.

In accordance with another aspect of the invention, a dual-chip circuit with distributed regulated power is provided. One chip is an integrated circuit chip with conducting pads and a number of through-silicon-vias formed within the peripheral region. A set of through-silicon-vias are formed within the non-periphery region of the integrated circuit chip, which are in electrical communication with circuits located within the non-periphery region of the integrated circuit chip. The second chip is a support substrate providing mechanical support to the integrated circuit chip. The support substrate includes a voltage regulator which couples each peripheral TSV to a corresponding TSV located within the non-periphery region. The voltage regulator supplies regulated power from the through-silicon-vias located within the periphery region to the through-silicon-vias located within the non-periphery region, thus providing a constant voltage to circuits located within the non-periphery region.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for distributing power to the interior of an integrated circuit (IC) chips using through-silicon-vias (TSVs). It will be obvious, however, to one skilled in the art, that the present invention may be practiced without some or all of these specific details. In other instances, well known process operations have not been described in detail in order not to unnecessarily obscure the present invention.

A through-silicon-via is a metalized via which provides electrical communication through the thickness of an integrated circuit. The formation of the through-silicon-vias is integrated into the overall circuit manufacturing process and there are several well-known methods which can be used to manufacture TSVs. Further details of through-silicon-via processing may be found in "Through-Silicon Vias: Ready for Volume Manufacturing?" by Peter Singer, Semiconductor International, no. 3, March 2008. This article is incorporated by reference for all purposes. In embodiments described below, configurations utilizing TSVs for power distribution to the interior of the integrated circuit are provided.

Figure 1:
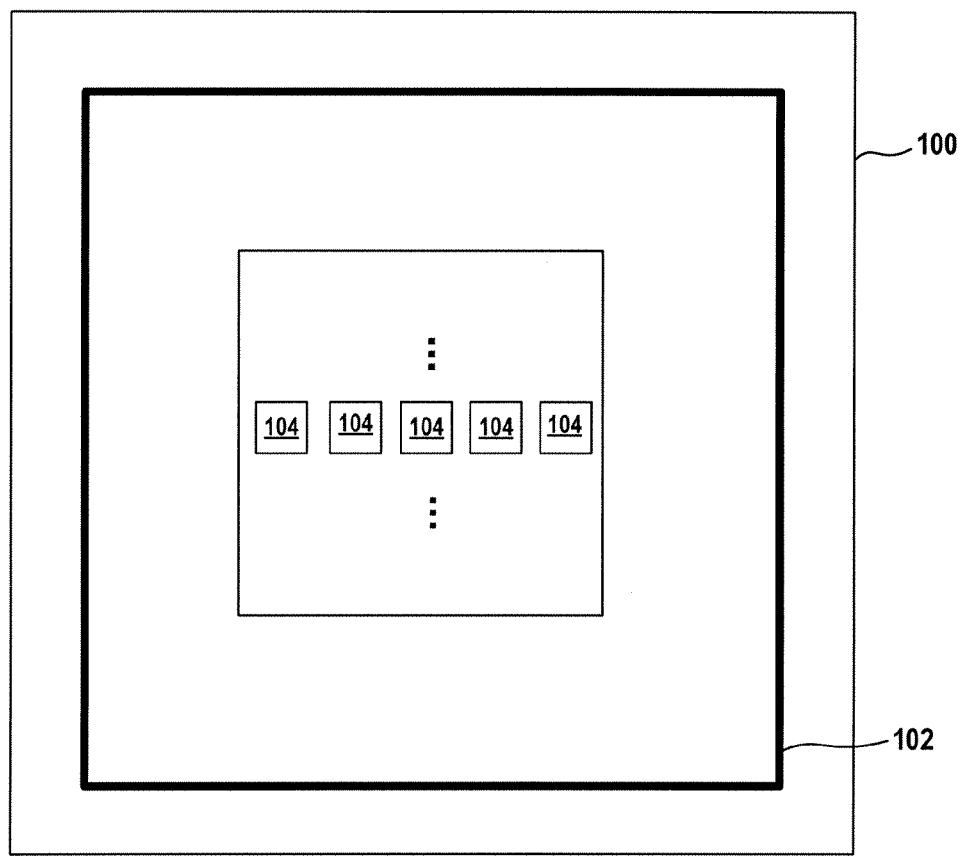
FIG. 1 illustrates top view of an integrated circuit chip utilizing through-silicon-vias in accordance with one embodiment of the present invention.

FIG. 1 illustrates top view of an integrated circuit chip utilizing through-silicon-vias in accordance with one embodiment of the present invention. An integrated circuit chip 100 is a semiconductor chip, such as microprocessors, field programmable gate arrays (FPGAs), application specific integrated circuits (ASICs), flash memories, or complex programmable logic devices (CPLDs). The integrated circuit 100 has a number of conducting pads on a top surface located along the periphery and forming a pad ring 102. The pad ring 102 is configured to convey inputs and outputs to and from the integrated circuit 100, as well to provide power and ground. A number of logic elements 104 performing logic operations are fabricated within the integrated circuit chip 100.

Figure 1A:
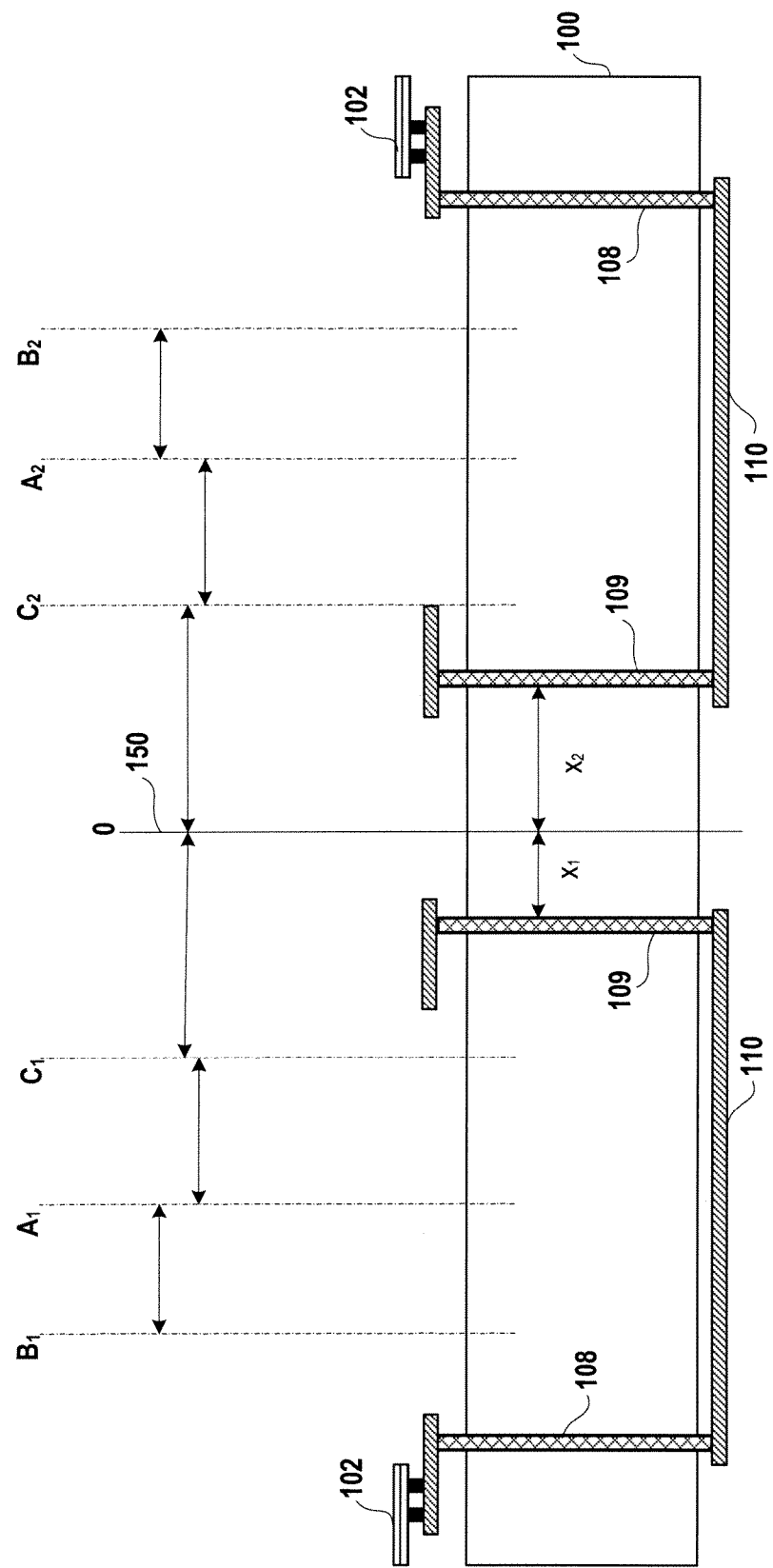
FIG. 1A illustrates a cross-sectional view of an integrated circuit chip utilizing through-silicon-vias in accordance with one embodiment of the present invention.

FIG. 1A illustrates a cross-sectional view of an integrated circuit chip utilizing through-silicon-vias in accordance with one embodiment of the present invention. The integrated circuit chip 100 is formed on the active frontside of a semiconductor substrate. The integrated circuit chip 100 can be divided into a periphery region (PR) and a non-periphery region (NPR). The non-periphery region is the interior area where the active device processing occurs and is defined from the center 150 of the semiconductor substrate and moving out toward the conducting pads 102. The area encompassed by the non-periphery region varies depending on the specific layout of the active processing region of the integrated circuit 100. In one IC layout, the non-periphery region could span the area between $C_1$ and $C_2$, and in another IC layout, the non-periphery region may span the area between $A_1$ and $A_2$.

The periphery region is defined from the bonding pad 102 area to the boundary of the non-periphery region. In one IC layout, the periphery portion extends from the bonding pads 102 to $B_1$ and $B_2$, while in another IC layout the periphery portion extends from the bonding pads 102 to $C_1$ and $C_2$. The boundaries dividing the integrated circuit chip 100 into the periphery region and the non-periphery region are exemplary and therefore are not meant to be limiting.

A plurality of bonding pads 102 are formed in the periphery portion of the integrated circuit chip 100. To address the issue of resistive voltage loss in a long conductive line, a number of TSVs 108 and 109 may be used to route power and ground from the bonding pads 102, to the non-periphery region of the integrated circuit chip 100. A set of through-silicon-vias 108, which provide electrical communication to the backside of the semiconductor substrate, are formed within the periphery region of the IC chip 100. A corresponding number of TSVs 109 is formed within the non-periphery region of the semiconductor substrate, offset from the center 150 by a distance $X_1$ and $X_2$. In one embodiment, the distance $X_1$ from the center 100 is different than the distance $X_2$. The distances of the non-periphery TSVs 109 from the center of the IC chip 100 are provided for illustrative purposes and are not limiting. A conductive line 110 is used to couple each periphery TSV 108 to the corresponding non-periphery TSV 109.

Figure 1B:
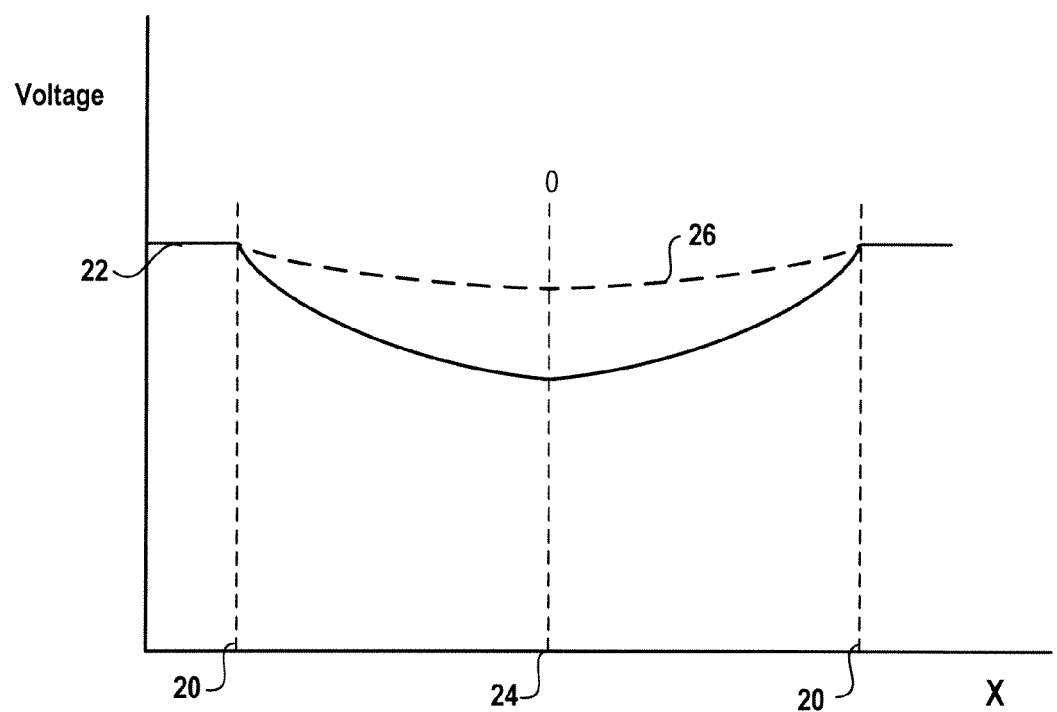
FIG. 1B illustrates a power supply voltage as a function of position of the integrated circuit in the x-direction in accordance with one embodiment of the present invention.

FIG. 1B illustrates a power supply voltage as a function of position of the integrated circuit in the x-direction in accordance with one embodiment of the present invention. Power and ground are provided to the integrated circuit from bonding pads through the use of conductive lines. Conductive lines have a resistance, which becomes an appreciable resistance as the conductive lines increase in length. Thus, logic elements which are located within the non-periphery region of the integrated circuit may receive a significantly lower voltage compared to logic elements located at the periphery.

Between the extreme ends 20 of the integrated circuit chip where the bonding pads are located, the voltage 22 on the conductive line is equal to the power supply voltage. An exemplary voltage power supply voltage for 65 nm technology is 1.0 V. By moving in the x-direction and observing the voltage on the conductive line, it is seen the voltage 22 starts to decrease due to the resistance in the conductive line. The observed voltage reaches a minimum at a position around the center of the integrated circuit 24. By way of example, a logic element located within the non-periphery region of the integrated circuit might receive a supply voltage of approximately 0.8V after the resistive voltage loss in the conductive line. Using a plurality of TSVs to distribute power to the non-periphery region of the integrated circuit reduces the effect of resistive voltage drops on a conducting line and the observed voltage at the non-periphery region of the integrated circuit is roughly the same as the power supply voltage 26. The recitation of specific voltage values are exemplary and therefore are not meant to be limiting.

Figure 2:
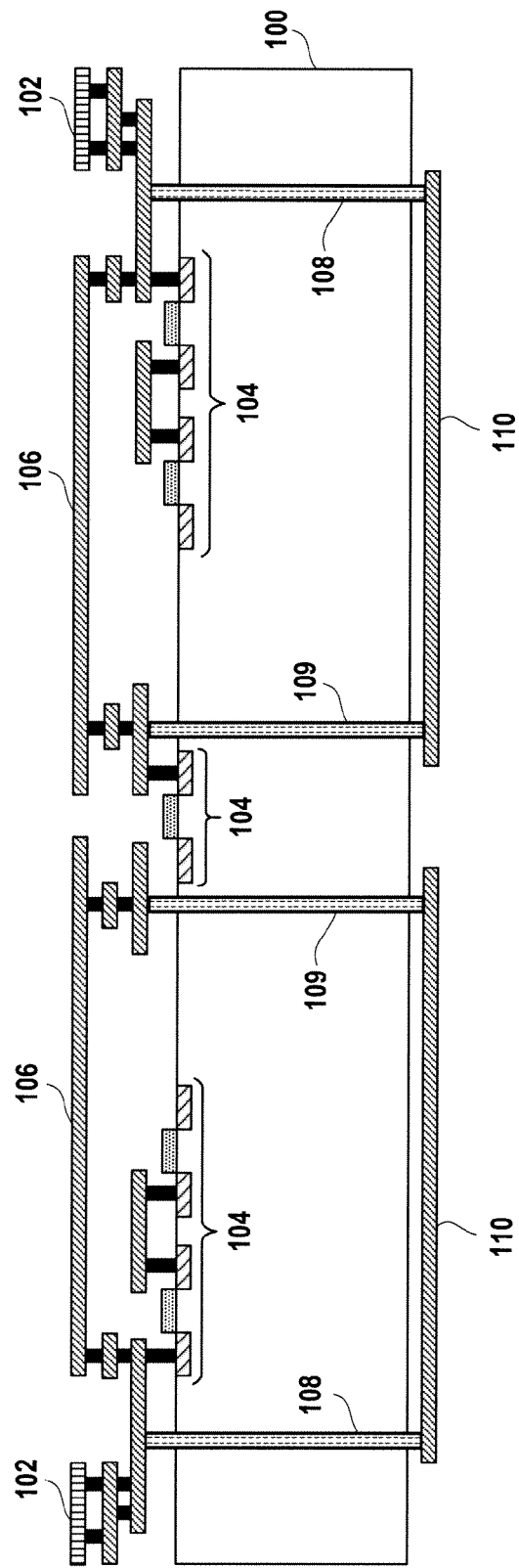
FIG. 2 illustrates a cross-sectional view of an integrated circuit utilizing through-silicon-vias in accordance with one embodiment of the present invention.

FIG. 2 illustrates a cross-sectional view of an integrated circuit utilizing through-silicon-vias to distribute power and ground to the non-peripheral region in accordance with one embodiment of the present invention. The integrated circuit chip 100 has a number of logic elements 104 distributed throughout the non-periphery region. The conductive lines 110 on the bottom surface of the integrated circuit 100 coupling each periphery TSV 108 to a corresponding TSV located within the NPR 109 provides electrical communication between the conductive bondpads 102 and the non-periphery region of the integrated circuit chip 100. Thus, a power source coupled to the conductive bondpads 102 becomes located at the non-periphery region on the frontside of the semiconductor substrate. Logic elements 104 located within the non-periphery region can then receive power and ground from the TSVs located within the non-periphery region 109. In one embodiment, a conductive line 106 on the top surface of the integrated circuit 100 provides a parallel path of electrical communication between the conducting pads 102 and the logic elements 104. This parallel path of power distribution works in conjunction with the TSVs 108 and 109 and the conductive lines 110 on the bottom surface to provide power and ground to the logic elements 104 located within the non-periphery region.

Figure 2A:
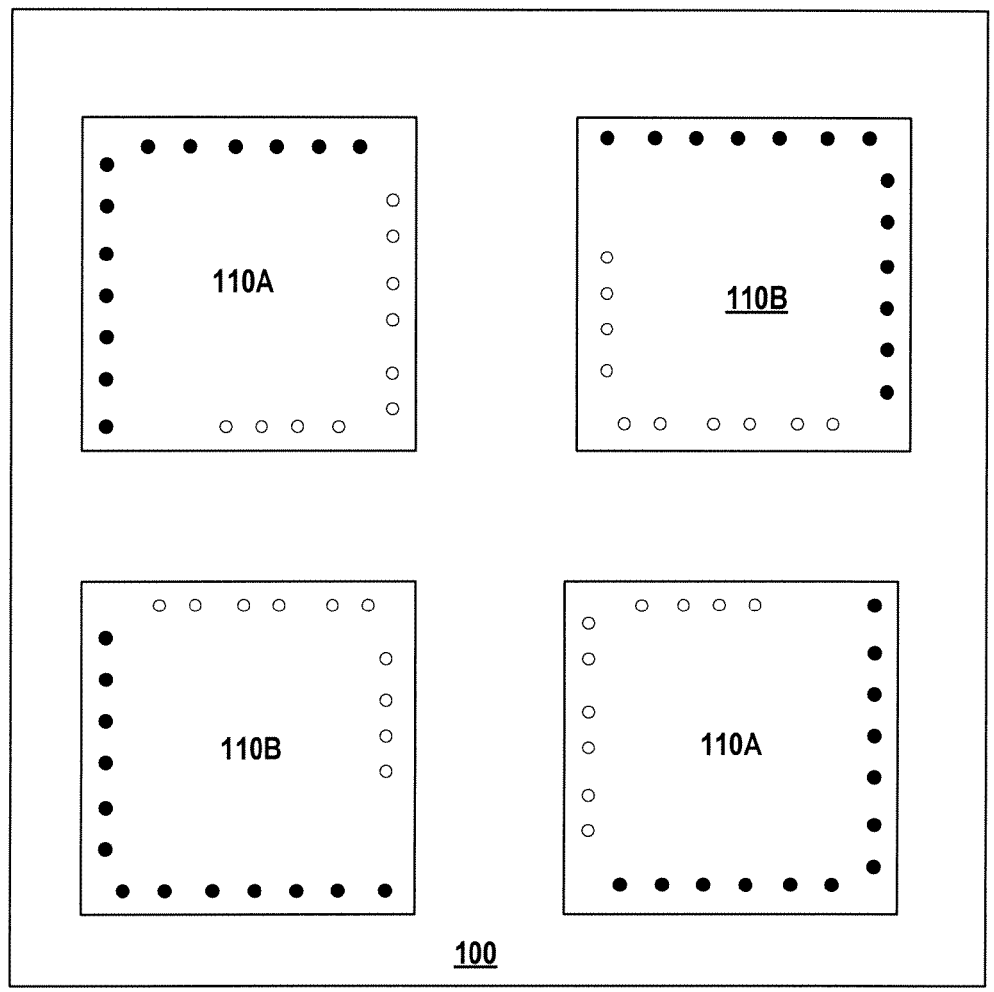
FIG. 2A illustrates the bottom side view of an integrated circuit with conductive areas to distribute power and ground to the non-periphery region in accordance with one embodiment of the present invention.

FIG. 2A illustrates the bottom side view of an integrated circuit with conductive areas to distribute power and ground to the non-periphery region in accordance with one embodiment of the present invention. The backside of the integrated circuit chip can be partitioned into conductive areas providing ground 110A and conductive areas providing power 110B to the logic elements on the frontside of the semiconductor substrate. In one embodiment, the conductive areas 110A and 110B are manufactured by patterning conductive metal on the backside of the semiconductor substrate.

TSVs in the periphery region are coupled to the side of the conductive area at the edge of the integrated circuit chip 100 to provide ground to the ground conductive areas 110A and power to the power conductive areas 110B. Logic elements within the non-periphery region can access power and ground through TSVs coupling to the conductive areas 110A and 110B. The shape of the conductive areas 110A and 110 are exemplary, and therefore are not meant to be limiting.

Figure 3:
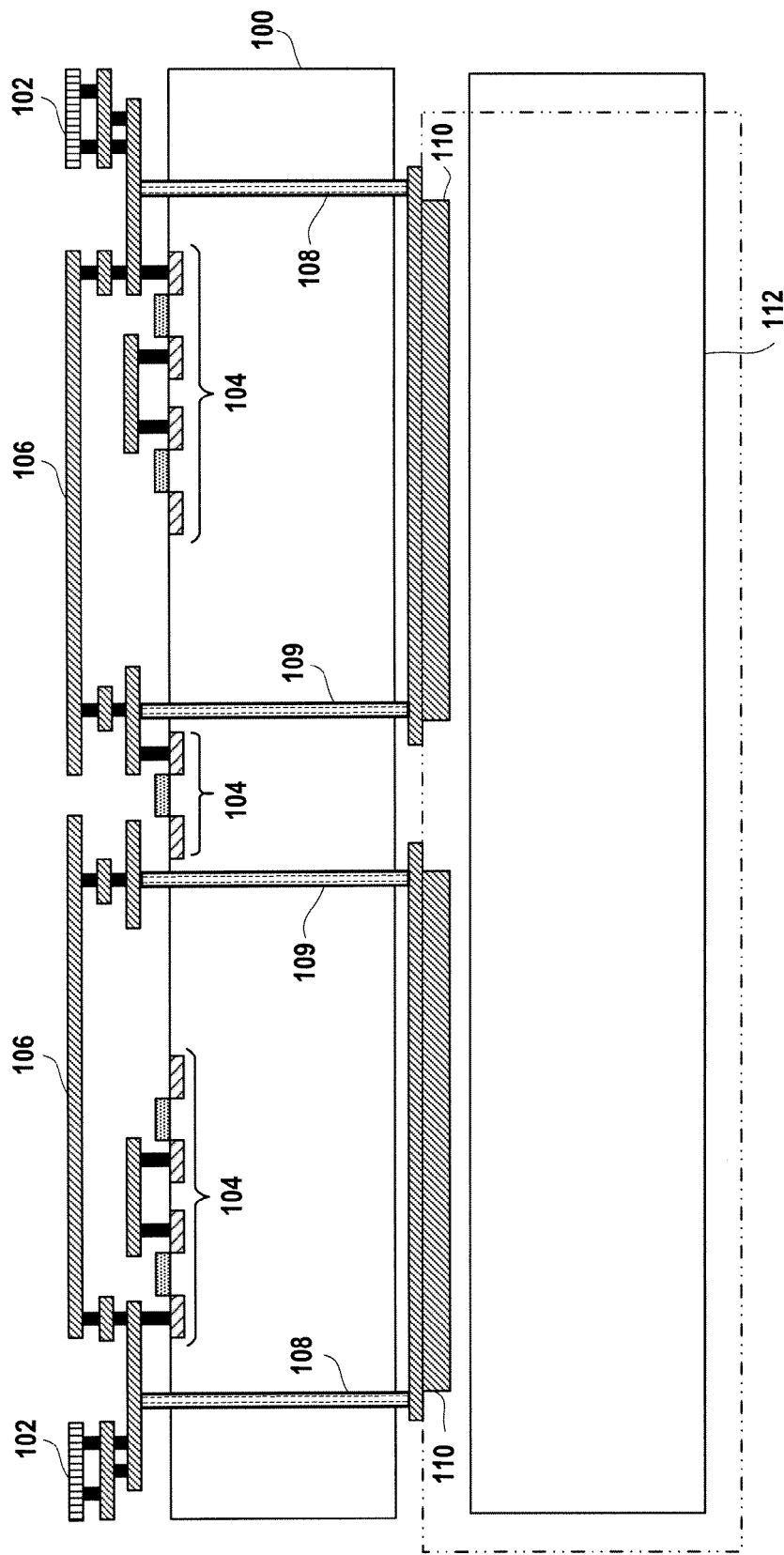
FIG. 3 illustrates a cross-sectional view of an integrated circuit utilizing through-silicon-vias with a mechanical support substrate in accordance with one embodiment of the present invention.

FIG. 3 illustrates a cross-sectional view of an integrated circuit utilizing through-silicon-vias with a mechanical support substrate in accordance with one embodiment of the present invention. Several manufacturing methods used to produce through-silicon-vias 108 and 109 reduce the thickness of the semiconductor substrate on which the integrated circuit chip 100 is fabricated. A support substrate 112 may be used to provide mechanical support for a semiconductor substrate with a reduced thickness. In one embodiment, the integrated circuit chip 100 can be mounted on a surface of the support substrate 112 using any of several well-known methods of bonding a semiconductor substrate to a support substrate 112. By way of example, the support substrate 112 may be a silicon substrate, though this embodiment is exemplary and therefore is not meant to be limiting. The support substrate 112 may be composed of any material, so long as the essential function of providing mechanical support to the integrated circuit chip 100 without adversely affecting the yield is retained.

Figure 4:
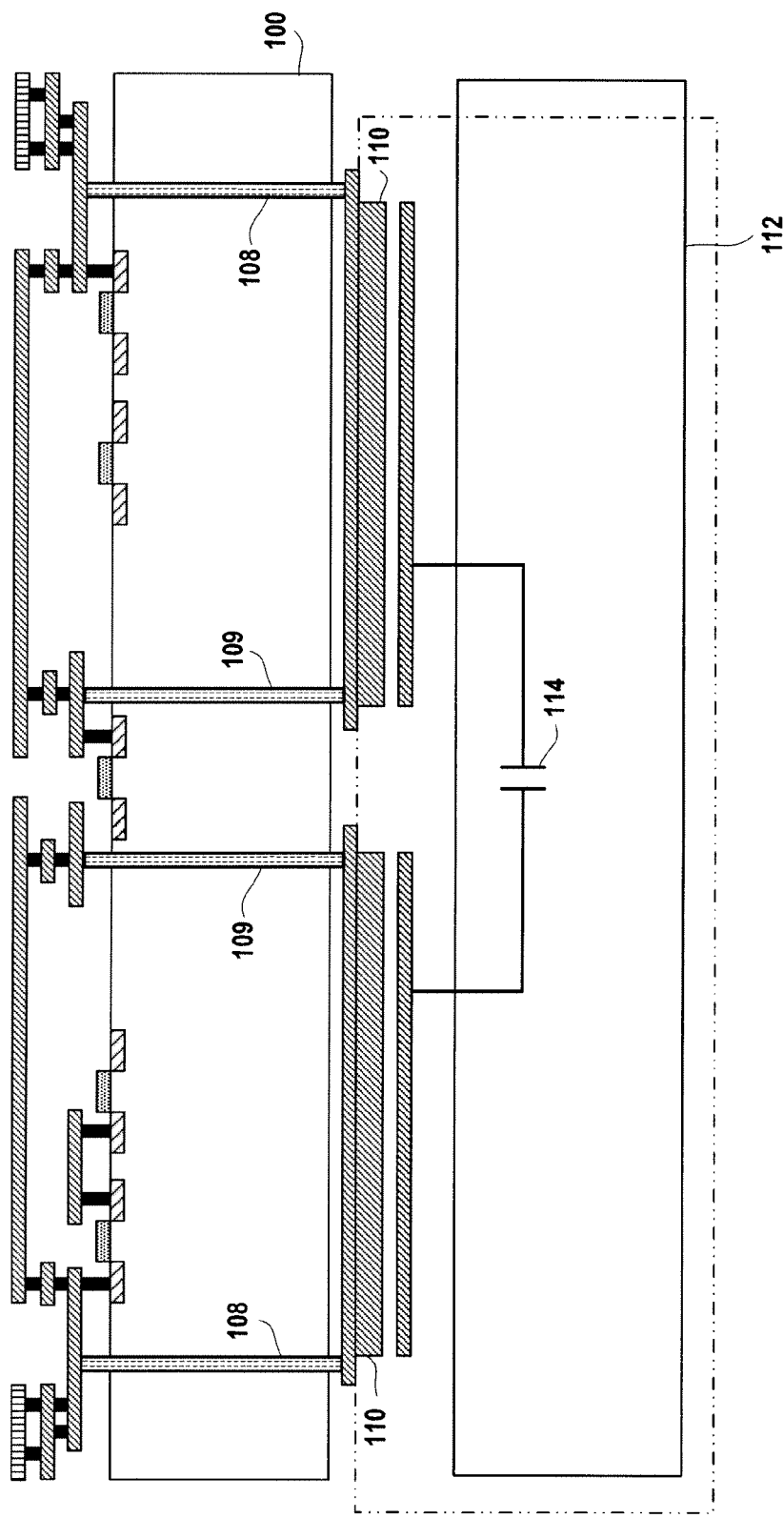
FIG. 4 illustrates a cross-sectional view of an integrated circuit utilizing through-silicon-vias with a decoupling capacitor implemented in the support substrate in accordance with one embodiment of the present invention.

FIG. 4 illustrates a cross-sectional view of an integrated circuit utilizing through-silicon-vias with a decoupling capacitor implemented in the support substrate in accordance with one embodiment of the present invention. While the primary function of the support substrate 112 is to provide mechanical support to the integrated circuit chip 100, a semiconductor support substrate 112 can also be enhanced to provide decoupling capacitors 114 between power and ground provided to the logic elements 104 using through-silicon-vias 108 and 109.

Figure 4A:
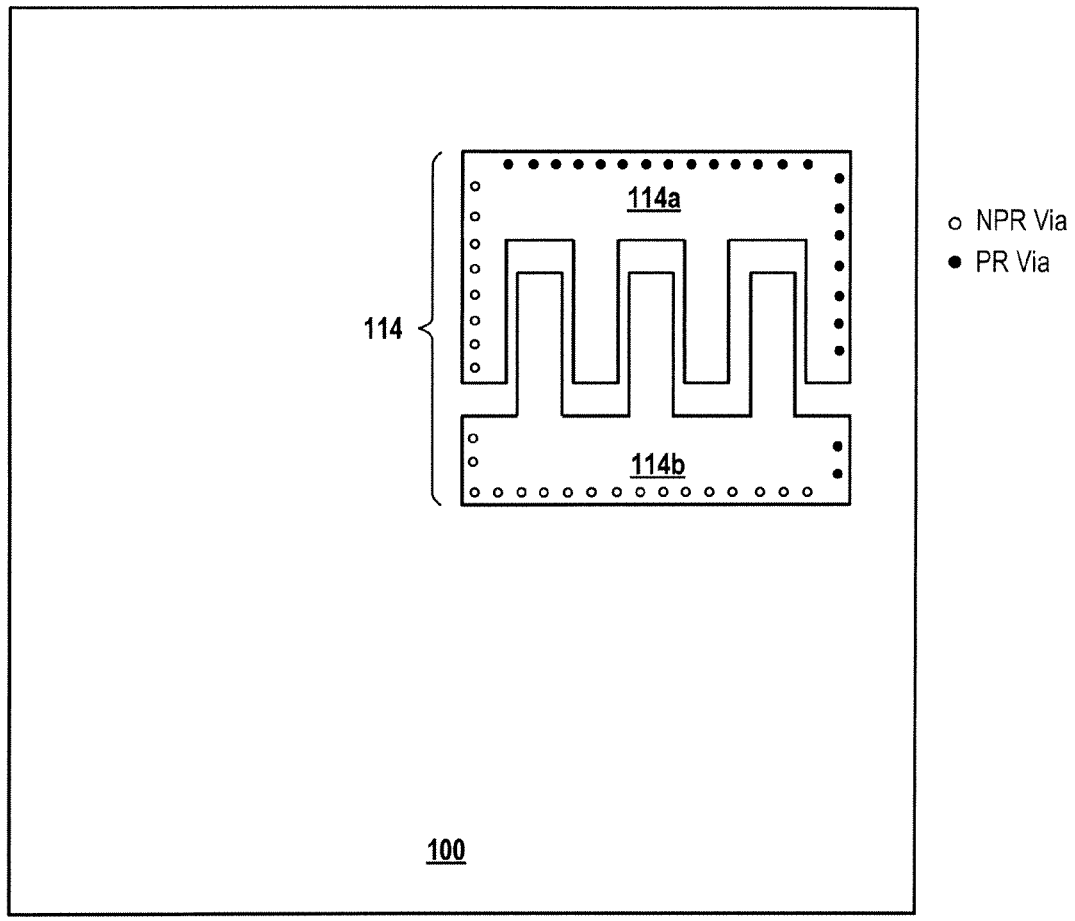
FIG. 4A illustrates a bottom side view of a metal comb decoupling capacitor implemented in the support substrate in accordance with one embodiment of the present invention.

FIG. 4A illustrates a bottom side view of a metal comb decoupling capacitor implemented in the support substrate in accordance with one embodiment of the present invention. The capacitor 114 can be implemented using patterned metal to form a comb structure capacitor on the support substrate and manufactured using a large-dimensioned complimentary metal oxide semiconductor (CMOS) process to keep costs relatively low and maintain high yields. One terminal 114A of the metal comb decoupling capacitor can be coupled to ground through a subset of through-silicon-vias located within the periphery region above the terminal 114A. The other terminal 114B can be coupled to power through another subset of through-silicon-vias located in the periphery region above the terminal 114B. Logic elements within the non-periphery region of the integrated circuit chip 100 can receive power and ground by connecting TSVs within the non-periphery region to the appropriate terminals 114A and 114B of the decoupling capacitor 114. It should be appreciated that this is one particular implementation of the embodiment described herein and is exemplary and therefore not meant to be limiting.

The decoupling capacitor 114 provides passive storage and active delivery of power to the logic elements 104 located at the center portion of the integrated circuit chip 100. When logic elements 104 coupled to the capacitor 114 are not drawing power, the capacitor 114 is storing charge. Once the logic elements 104 within the non-peripheral portion of the integrated circuit chip 100 start to draw power, the charge stored in the decoupling capacitor 114 is discharged to the logic elements 104 within the non-periphery region.

Figure 5:
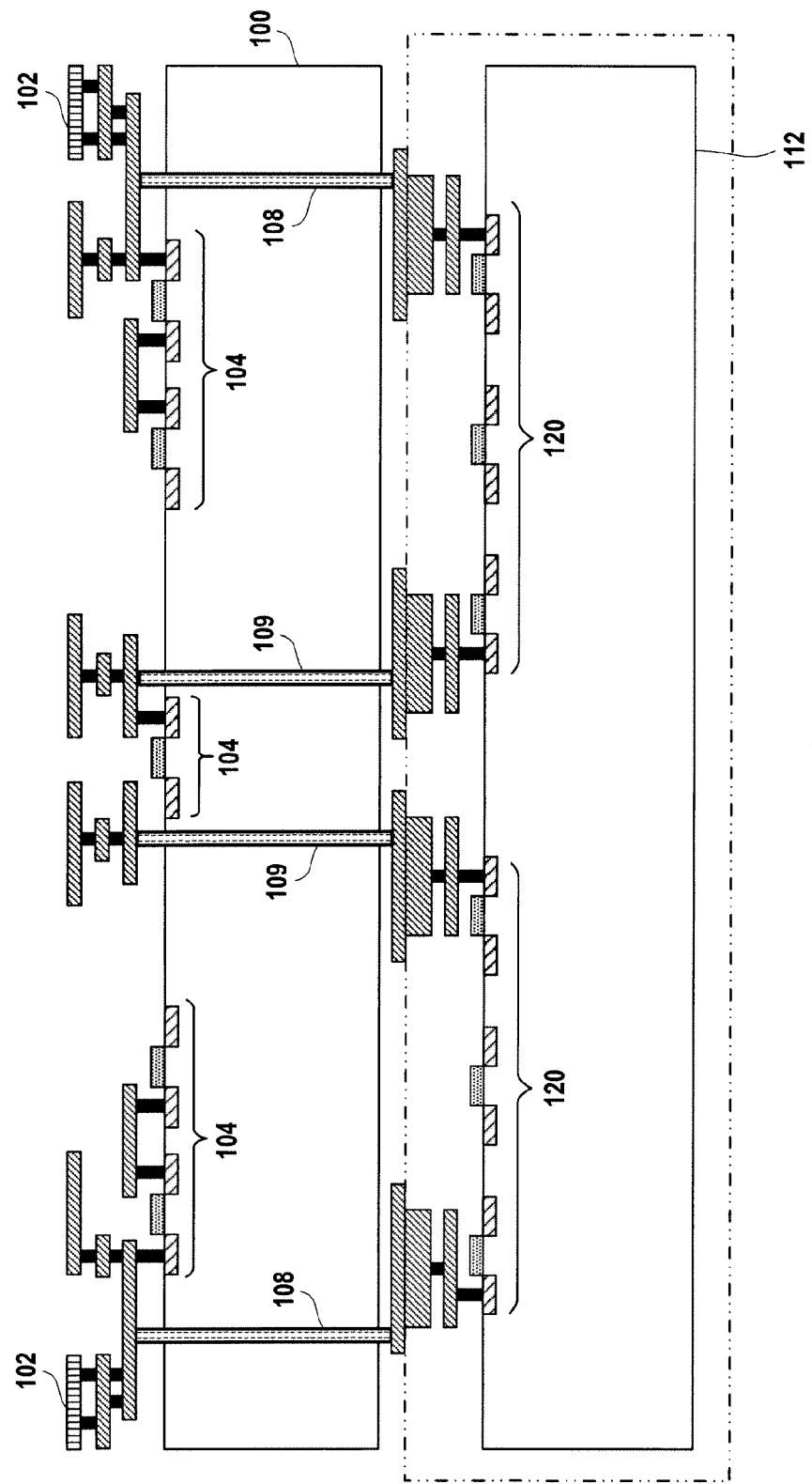
FIG. 5 illustrates a cross-sectional view of an integrated circuit utilizing through-silicon-vias with a voltage regulator implemented in the support substrate in accordance with one embodiment of the present invention.

FIG. 5 illustrates a cross-sectional view of an integrated circuit utilizing through-silicon-vias with a voltage regulator implemented in the support substrate in accordance with one embodiment of the present invention. Active regulation of the supply voltage to the logic elements 104 in the non-periphery region of the integrated circuit 100 can be implemented on a silicon support substrate 112 using conventional CMOS fabrication techniques. The voltage regulator 120 receives the power supply voltage from the through-silicon-vias located within the periphery region 108 and actively supplies a constant voltage to the through-silicon-vias 109 located in the NPR. In this way, the logic elements 104 located near the center of the integrated circuit chip 100 are provided regulated power and ground. The voltage regulator 120 may be implemented in any of the well known design techniques, so long as the essential function of providing a constant voltage is maintained.

In one embodiment, the voltage regulator 120 may include logic to adjust the voltage being provided to the logic elements 104 located near the center of the integrated circuit chip 100 through TSVs located within the non-periphery region 109. The voltage regulator 120 could be provided an input signal adjusting the supply voltage to a new value. For example, low power circuits for which the amount of current leakage is a concern could be located near the center of the integrated circuit chip 100 and receive a reduced supply voltage through the power regulator 120. In another embodiment, the voltage regulator 120 could put specific circuits 104 into a "sleep" mode during times where the circuits 104 are not active, thus reducing the overall power consumption of the integrated circuit 100. The cited examples are exemplary and therefore are not meant to be limiting.

Figure 6:
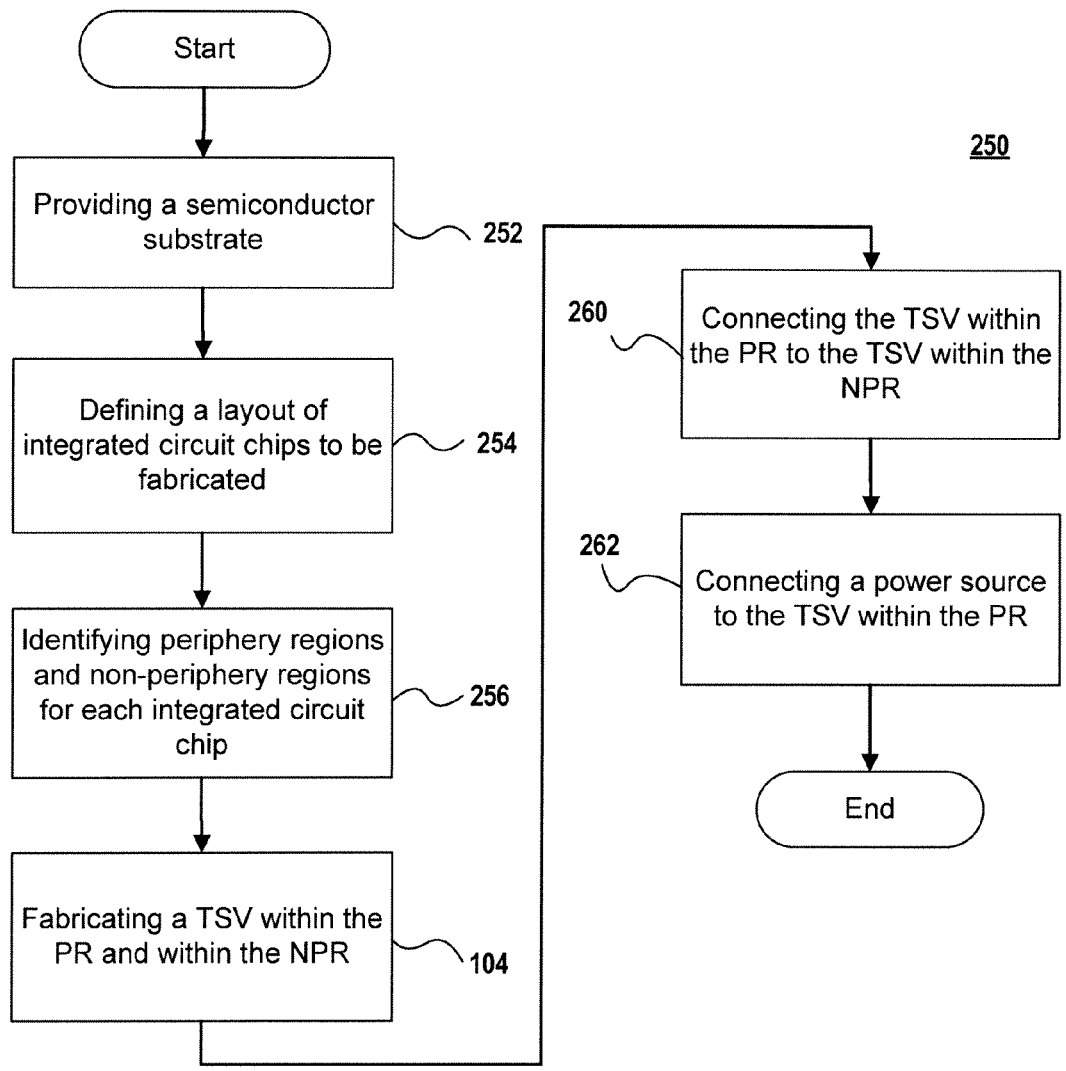
FIG. 6 illustrates a flow chart diagram illustrating method operations for power distribution to the non-periphery region of an integrated circuit chip using through-silicon-vias in accordance with one embodiment of the present invention.

FIG. 6 illustrates a flow chart diagram illustrating method operations for power distribution to the non-periphery region of an integrated circuit chip using through-silicon-vias in accordance with one embodiment of the present invention. The method 250 begins with operation 252, where a semiconductor substrate is provided. The semiconductor substrate has a frontside where active devices are fabricated and a backside that is opposite the frontside. The method advances to operation 254, in which the layout of integrated circuit chips to be fabricated on the semiconductor substrate is defined.

In operation 256, the periphery region and non-periphery region are identified for each integrated circuit chip to be fabricated on the semiconductor substrate, as illustrated in FIG. 1A. The method proceeds to operation 258, in which a through-silicon-via is fabricated within the periphery region and within the non-periphery region. In one embodiment, the TSVs are distributed throughout the NPR of the integrated circuit, thus providing distributed parallel paths for electrical communication between the conducting bondpads and the logic elements within the non-periphery region.

In operation 260, the through-silicon-via in the periphery region is connected to the through-silicon-via in the non-periphery region through the use of conductive lines along the backside of the semiconductor substrate, as illustrated in FIG. 2. In one embodiment, the TSVs are coupled to conductive areas to provide power and ground to logic elements within the non-periphery region, as illustrated in FIG. 2A. Operation 262 connects a power source to the TSV within the periphery region, so as to locate the power source to the non-periphery region on the frontside of the semiconductor substrate. Communication between the through-silicon-via within the periphery region with the through-silicon-via within the non-periphery region is provided by the conductive line along the backside of the semiconductor substrate.

In one embodiment, conducting lines on the frontside of the integrated circuit chip couple the conducting pads to the through-silicon-vias within non-periphery region, which provides a parallel conducting path for power and ground to the logic elements located within the non-periphery region of the integrated circuit, as illustrated in FIG. 2. In another embodiment, decoupling capacitors are coupled between the power and ground provided to the non-periphery region, as illustrated in FIG. 4.

The method and apparatus described herein may be incorporated into any suitable circuit, including processors and programmable logic devices (PLDs). The PLDs can include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by ALTERA CORPORATION.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution, or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit chip, comprising:
   a plurality of conducting pads on a first surface of the integrated circuit for providing power and ground, the plurality of conducting pads located in a periphery region of the integrated circuit chip;
   a first plurality of through-silicon-vias within the periphery region of the integrated circuit chip;
   a second plurality of through-silicon-vias within a non-periphery region of the integrated circuit chip; and
   a first conducting line providing electrical communication between one of the first plurality of through-silicon-vias and one of the second plurality of through-silicon-vias, the first conducting line extending along a second surface of the integrated circuit chip from the one of the first plurality of through-silicon-vias to the one of the second plurality of through-silicon-vias, the second surface opposing the first surface, wherein each via of the first plurality of through-silicon-vias and the second plurality of the through silicon vias extend from the first surface to the second surface and wherein one of power and ground is supplied to a plurality of circuits located within the non-periphery region of the integrated circuit chip through a path defined by the one of the first plurality of through-silicon-vias, the first conducting line, and the one of the second plurality of through-silicon-vias.

2. The integrated circuit chip of claim 1, further comprising:
   a support substrate having a support surface for interfacing with the second surface of the integrated circuit chip, the support surface being adjacent to the first conducting line and providing mechanical support for the integrated circuit chip.

3. The integrated circuit chip of claim 2, further comprising:
   a decoupling capacitor defined on the support substrate, the capacitor coupled to the first conducting line.

4. The integrated circuit chip of claim 3, wherein the decoupling capacitor is coupled to the first conducting line through the support substrate.

5. The integrated circuit chip of claim 1, further comprising:
a second conducting line extending along the first surface coupling one of the plurality of conducting pads to the one of the second plurality of through-silicon-vias, wherein the second conducting line extending along the first surface provides a parallel conducting path for power and ground to the plurality of circuits located within the non-periphery region of the integrated circuit chip.

6. The integrated circuit chip of claim 1, further comprising:
a voltage regulator coupled to the one of the second plurality of through-silicon-vias, thereby providing regulated power to the non-periphery region of the integrated circuit chip.

7. The integrated circuit chip of claim 6, wherein the voltage regulator is implemented in a support substrate.

8. The integrated circuit chip of claim 1, further comprising:
a plurality of capacitors implemented in a comb metal capacitor.

9. The integrated circuit chip of claim 1, the plurality of circuits further comprising:
a plurality of logic elements, wherein the one of the second plurality of through-silicon-vias is operable to provide one of power and ground to the plurality of logic elements.

10. An integrated circuit, comprising:
a plurality of conducting pads on a first surface of the integrated circuit operable to provide power and ground, the plurality of conducting pads located in a periphery region of the integrated circuit;
a first plurality of through-silicon-vias within the periphery region of the integrated circuit and a second plurality of through-silicon-vias within a non-periphery region of the integrated circuit, each via of the first plurality of through silicon vias and the second plurality of through silicon vias extending from the first surface to an opposing second surface of the integrated circuit; and
a first plurality of conducting lines, each line of the first plurality of conducting lines operable to provide electrical communication between one of the first plurality of through-silicon-vias and a corresponding one of the second plurality of through-silicon-vias within the non periphery region, the first plurality of conducting lines extending along the second surface of the integrated circuit chip from the one of the first plurality of through-silicon-vias to the one of the second plurality of through-silicon-vias, and wherein one of power and ground is supplied to a plurality of circuits located within the non-periphery region of the integrated circuit through a path defined by the one of the first plurality of through-silicon-vias, one of the first plurality of conducting lines, and the corresponding one of the second plurality of through-silicon-vias.

11. The integrated circuit of claim 10, further comprising:
a support substrate having a support surface for interfacing with the second surface of the integrated circuit, the support surface being adjacent to the first plurality of conducting lines and providing mechanical support for the integrated circuit.

12. The integrated circuit of claim 11, further comprising:
a plurality of decoupling capacitors defined on the support substrate, each capacitor coupled to a corresponding one of the first plurality of conducting lines providing power and ground to the periphery region of the integrated circuit.

13. The integrated circuit of claim 12, wherein each decoupling capacitor is coupled to corresponding conducting lines through the support substrate.

14. The integrated circuit of claim 12, wherein each of the plurality of capacitors is implemented in a comb metal capacitor.

15. The integrated circuit of claim 10, further comprising:
a second plurality of conducting lines on the first surface, each of the second plurality of conducting lines coupling a conducting pad of the plurality of conducting pads to the one of the second plurality of through-silicon-vias.

16. The integrated circuit of claim 10, further comprising:
a voltage regulator coupled to the second plurality of through-silicon-vias, thereby providing regulated power to the non-periphery region of the integrated circuit.

17. The integrated circuit of claim 16, wherein the voltage regulator is implemented in a support substrate.

18. The integrated circuit chip of claim 10, the plurality of circuits further comprising:
a plurality of logic elements, wherein the second plurality of through-silicon-vias is operable to provide power and ground to the plurality of logic elements.

* * * * *